(12) United States Patent
Lai

(10) Patent No.: US 8,190,110 B2
(45) Date of Patent: May 29, 2012

(54) POWER AMPLIFIER COMPRISING A SLOTTED POWER COMBINER

(75) Inventor: Chee Hong Lai, Cupertino, CA (US)

(73) Assignee: Fujitsu Semiconductor Limited, Kanagawa (JP)

( * ) Notice: Subject to any disclaimer, the term of this patent is extended or adjusted under 35 U.S.C. 154(b) by 619 days.

(21) Appl. No.: 12/363,978

(22) Filed: Feb. 2, 2009

(65) Prior Publication Data
US 2010/0197251 A1    Aug. 5, 2010

(51) Int. Cl.
*H04B 1/04* (2006.01)
(52) U.S. Cl. .................................... 455/129
(58) Field of Classification Search ............ 455/129
See application file for complete search history.

(56) References Cited

U.S. PATENT DOCUMENTS 7,268,616 B2 * 9/2007 Burns et al. ............ 330/124 R

FOREIGN PATENT DOCUMENTS

| JP | 2004-112396 A | 4/2004 |
|---|---|---|
| JP | 2006-067176 A | 3/2006 |

OTHER PUBLICATIONS

W. H. Doherty, "A New High-Efficiency Power Amplifier for Modulated Waves," *Bell Telephone System Technical Publications*, presented at the Annual Convention of The Institute of Radio Engineers, Cleveland, Ohio, May 1936, 25 pages.
Christopher Burns, "Highly efficient amplifier shows the promise of Doherty architecture," *RFDesign*, Jun. 21, 2007, 3 pages.

* cited by examiner

*Primary Examiner* — Lincoln Donovan
*Assistant Examiner* — Daniel Rojas
(74) *Attorney, Agent, or Firm* — Baker Botts L.L.P.

(57) ABSTRACT

According to one embodiment, a power combiner configured to receive at least two input signals and combine the input signals to generate an output signal. The power combiner may include at least two input layers and an output layer located between the input layers. Each layer may be in the shape of a slotted loop.

22 Claims, 4 Drawing Sheets

POWER AMPLIFIER COMPRISING A SLOTTED POWER COMBINER

TECHNICAL FIELD

This present disclosure relates generally to power amplification and more particularly to a slotted power combiner.

BACKGROUND

The amplification of power may generally involve the use of transistors. These transistors accept an input signal and magnify the signal to increase output power. However, it may be difficult to obtain a high output power from transistors alone.

SUMMARY

According to one embodiment, a power combiner configured to receive at least two input signals and combine the input signals to generate an output signal. The power combiner may include at least two input layers and an output layer located between the input layers. Each layer may be in the shape of a slotted loop.

Various embodiments of the slotted power combiner may benefit from numerous advantages. It should be noted that one or more embodiments may benefit from some, none, or all of the advantages discussed below. In particular embodiments, high output power can be achieved. The high output power may be useful in various wireless applications such as mobile phone transmitters, wireless network cards, and other wireless communications systems. According to some embodiments, the slotted power combiner may also allow for tuning the power output level to meet the changing power demands of the wireless communications system. In addition, slotted power combiners may be smaller and/or more efficient than known power amplifiers. Other technical advantages may become readily apparent to one of ordinary skill in the art after review of the following figures, description, and claims.

DETAILED DESCRIPTION

Embodiments of the present invention and its advantages are best understood by referring to FIGS. 1 through 5 of the drawings, like numerals being used for like and corresponding parts of the various drawings.

Figure 1:
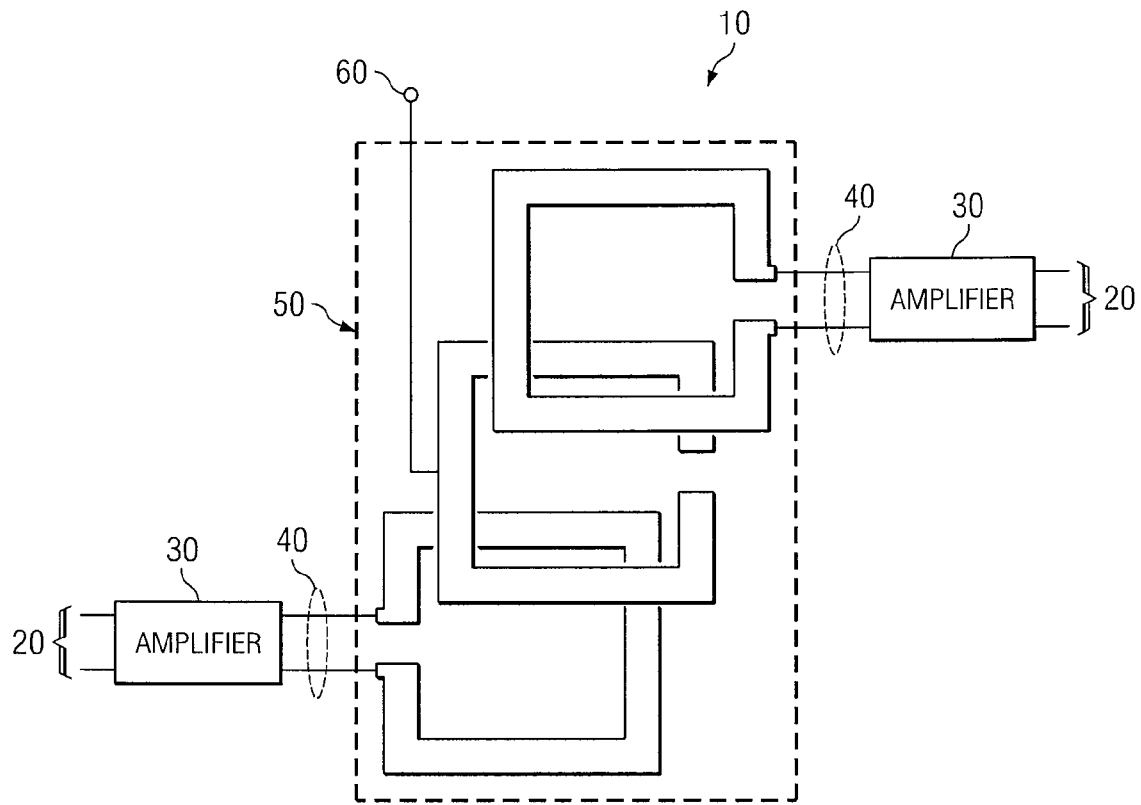
FIG. 1 illustrates an example of a power amplification system comprising a slotted power combiner.

FIG. 1 illustrates power amplification system 10, according to certain embodiments. In some embodiments, power amplification system 10 may be used in integrated circuits to produce a high output power. Power amplification system 10 may comprise input signal 20, amplifier 30, amplified signal 40, power combiner core 50, and combined signal 60.

According to certain embodiments, power amplification system 10 may direct input signal 20 to amplifier 30. In some embodiments, amplifier 30 may be a Doherty amplifier. Amplifier 30 may increase the amplitude of input signal 20 to generate amplified signal 40 at its output. In some embodiments, amplified signal 40 may be a differential signal. Amplified signal 40 may be directed to power combiner core 50. Power combiner core 50 may combine amplified signals 40 to generate combined signal 60 at its output. According to some embodiments, the power of combined signal 60 is much higher than the power of input signal 20.

Power amplification system 10 may be used for any appropriate purpose. For example, power amplification system 10 may be used in general electrical amplifiers or in millimeter wave technologies. In some embodiments, power amplification system 10 may be used to generate a sufficient level of power to support applications in wireless communications systems. For example, power amplification system 10 may be used in orthogonal frequency division multiplexing (OFDM) systems such as WiMAX and/or Wi-Fi, in code division multiple access (CDMA) systems such as CDMA2000 and/or WCDMA, in Global System for Mobile communications (GSM) systems, or any suitable wireless communications system.

Power amplification system 10 may be more efficient than known power amplification systems. Improved efficiency may reduce overall power consumption, extend battery life, minimize cooling requirements, and/or lower operating expenses. In some embodiments, power amplification system 10 may allow for power tuning so that the power level may be adjusted dynamically according to the demands on the system at a given time. For example, in wireless communications systems, the power demands may be low when the access terminal is located near the system and high when the access terminal is located far away from the system.

Although FIG. 1 illustrates a particular embodiment that includes particular components that are each configured to provide certain functionality, alternative embodiments may include any appropriate combination of components with the described functionality divided between the components in any suitable manner. The components of the systems may be integrated or separated. Moreover, the operations of the systems may be performed by more, fewer, or other components. Additionally, operations of the systems may be performed using any suitable logic comprising software, hardware, and/or other logic. As used in this document, "each" refers to each member of a set or each member of a subset of a set.

Figure 2:
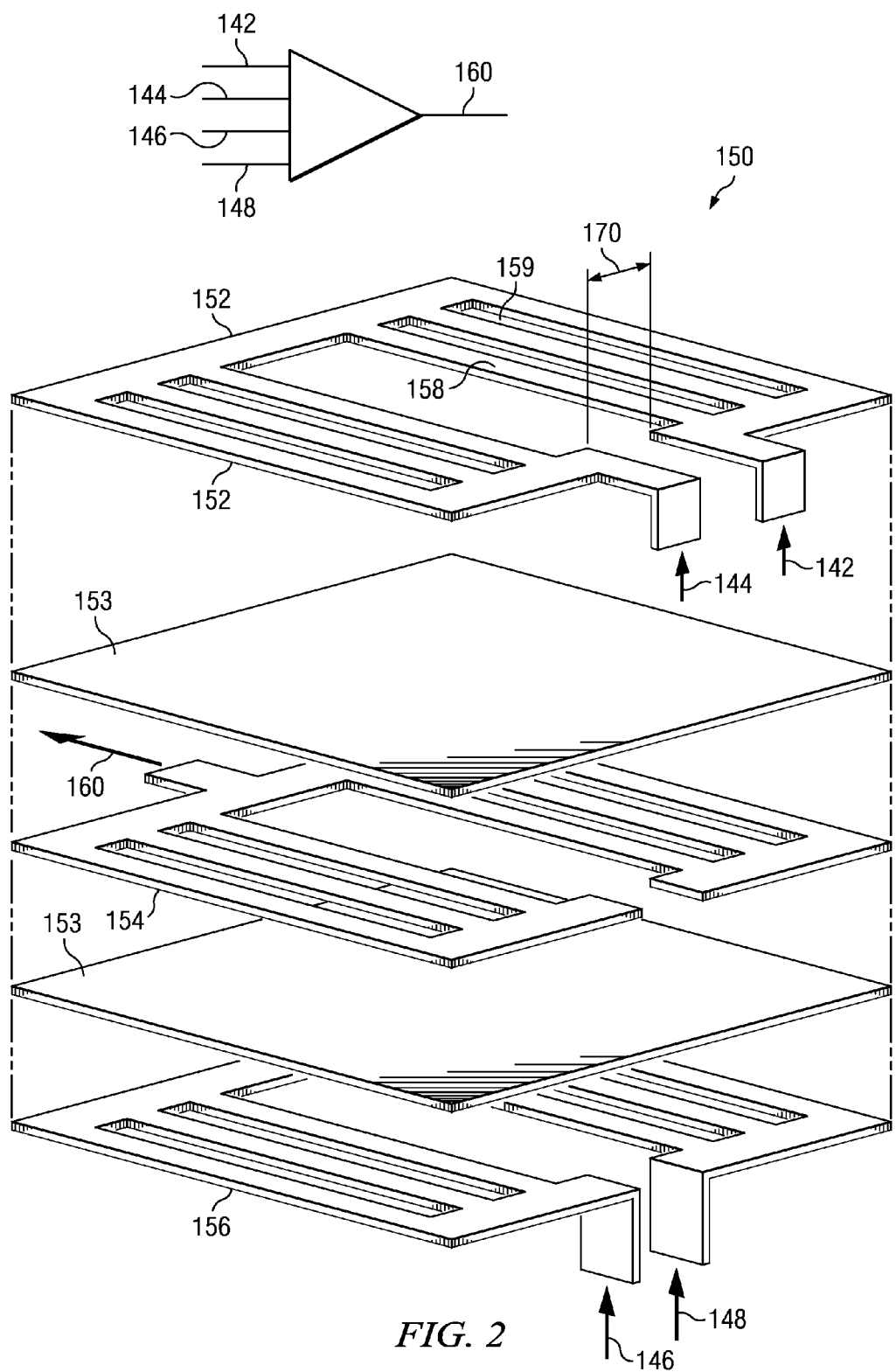
FIG. 2 illustrates an example of a power combiner core.

FIG. 2 illustrates an example of power combiner core 150 according to some embodiments. In some embodiments, power combiner core may be a passive structure. A passive structure may handle high power, may allow the power requirements on input amplifiers to be relaxed, and/or may allow power combiner core 150 to be operated without a biasing voltage. In some embodiments, power combiner core 150 may operate in the broadband spectrum to cover the range of frequencies used by various wireless applications.

According to some embodiments, power combiner core 150 may be an impedance load for amplifiers. The number of inputs from the amplifiers to power combiner core 150 may be scalable. For example, amplifiers may send inputs comprising amplified signals 142, 144, 146, and 148 to power combiner core 150. In some embodiments, power combiner core 150 accepts inputs and combines them to generate combined signal 160 at its output.

Power combiner core 150 may comprise multiple layers. In some embodiments, power combiner core 150 may comprise three layers. For example, power combiner core 150 may comprise top layer 152, middle layer 154, and bottom layer 156. In some embodiments, top layer 152, middle layer 154, and bottom layer 156 may be stacked to transfer power capacitively, to make use of complementary metal-oxide semiconductor (CMOS) processing techniques, and/or to reduce the board surface area required by power combiner core 150.

In some embodiments, the basic shape of top layer 152, middle layer 154, and bottom layer 156 may be substantially identical to the shape of the other layers. According to some embodiments, the perimeter of each layer may be shaped like a broken loop. The broken loop may be substantially square, rectangular, or any suitable shape. In some embodiments, the length of each side of the broken loop may range from approximately 100 to 1200 micrometers, however, the size of the broken loop may be scalable such that each side may be any suitable length. It should be understood that the size of the loop may affect the signal phase. In some embodiments, the loop may be broken along one or more sides by break 170. Break 170 may be substantially centered along the side of the loop that it breaks. The size of break 170 may be selected so that it is large enough to be read during the chip manufacturing process, but not so large as to substantially distort the signal phase. For example, break 170 may comprise approximately 2% to 10% of the length of the side of the loop on which it is located.

In some embodiments, top layer 152 may receive amplified signal 142 proximate to the open end comprising one side of break 170 and amplified signal 144 proximate to the open end comprising the other side of break 170. In some embodiments, an output connection may be located on middle layer 154 for combined signal 160 to exit power combiner core 150. The output connection may be substantially centered on the edge of the loop opposite break 170 of middle layer 154. In some embodiments, bottom layer 156 may receive amplified signal 146 proximate to the open end comprising one side of break 170 and amplified signal 148 proximate to the open end comprising the other side of break 170.

According to some embodiments, each layer of power combiner core 150 may comprise strips 158. The number of strips 158 may be scalable. In some embodiments, strips 158 may connect the side of the broken loop comprising break 170 to the side of the broken loop opposite break 170. Thus, strips 158 may run perpendicular to the side of the broken loop comprising break 170, for example. Strips 158 may be placed substantially symmetrically such that a first strip 158 on one side of break 170 runs parallel to a second strip 158 on the other side of break 170 and the distance between the first strip 158 and break 170 may be approximately equal to the distance between the second strip 158 and break 170. In some embodiments, strips 158 may be placed near the outside edges of power combiner core 150. In some embodiments, the width of a strip 158 may comprise approximately 10% to 15% of the length of the side of the loop running perpendicular to strips 158. In some embodiments, slots 159 may be formed by the space between a strip 158 on one side of break 170 and another strip 158 on the same side of break 170. In some embodiments, the width of a slot 159 may comprise approximately 1% to 1.5% of the length of the side of the loop running perpendicular to slots 159. A loop comprising strips 158 and slots 159 may be referred to as a slotted loop.

In some embodiments, the strips 158 and slots 159 on one layer of power combiner core 150 may be substantially identical to the strips 158 and slots 159 on the other layers of power combiner core 150. Strips 158 may cancel current from the center of the structure such as eddy currents that may tend to flow in a large conductor area (such as would exist if layers 152, 154, and 156 were solid plates). This cancellation may allow current to flow directly from input to output along the direction of strip 158 rather than in a circle. The direct flow from input to output may increase the efficiency of power combiner core 150. For example, the efficiency may be increased from 25% efficiency to 65% efficiency.

According to some embodiments, capacitive coupling may be used to couple the layers of power combiner core 150. In some embodiments, the layers of power combiner core 150 may comprise a conductor. The conductor may be a metal such as copper, aluminum, gold, silver, and/or any suitable metal. In some embodiments, the material between the layers may comprise an insulator 153. For example, the material between the layers may comprise silicon, silicon dioxide, germanium, gallium arsenide, or any suitable insulator 153. The layers of power combiner core 150 may be manufactured using known integrated circuit manufacturing techniques.

Although FIG. 2 illustrates a particular embodiment that includes particular components that are each configured to provide certain functionality, alternative embodiments may include any appropriate combination of components with the described functionality divided between the components in any suitable manner.

Figure 3:
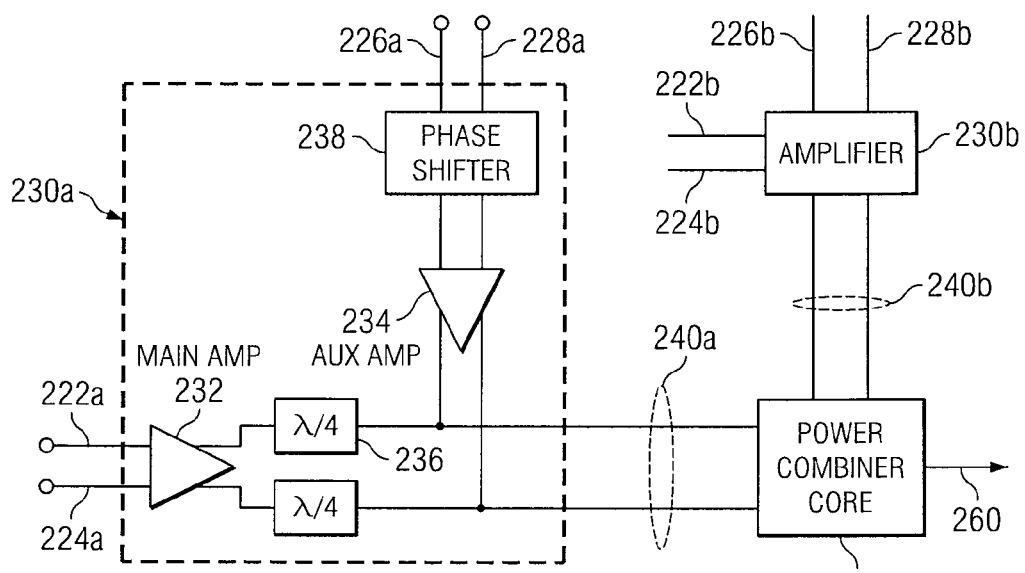
FIG. 3 illustrates an example of inputs to the power combiner core.

FIG. 3 illustrates an example of an input source for power combiner core 250 according to some embodiments. In some embodiments, power combiner core 250 may be like power combiner core 150. In some embodiments, input signals 222, 224, 226, and 228 may be directed to amplifier 230. Amplifier 230 may increase the amplitude of input signals 222, 224, 226, and 228 to generate amplified signals 240. Amplified signals 240 may be directed to power combiner core 250. According to some embodiments, amplified signals 240 from multiple amplifiers 230 may combined by power combiner core 250. For example, power combiner core 250 may combine amplified signals 240*a* with amplified signals 240*b* to generate combined signal 260.

Amplifier 230 may be any suitable type of amplifier. In some embodiments, amplifier 230 may be selected for its linearity and efficiency characteristics. For example, amplifier 230 may comprise a Doherty type amplifier characterized by high linearity and high efficiency.

A Doherty amplifier may comprise a main amplifier 232 in parallel with an auxiliary amplifier 234. Main amplifier 232 may be biased to operate in class A mode, class B mode, or class AB mode, for example. Auxiliary amplifier 234 may be biased to operate in class C mode, class E mode, or class F mode, for example. In some embodiments, the Doherty amplifier may be configured such that when the input signal is low, main amplifier 232 may be active and auxiliary amplifier 234 may be inactive and consume no power. When the input signal is high, main amplifier 232 and auxiliary amplifier 234 may both be active to enable maximum power output.

According to some embodiments, the Doherty type amplifier 230 may be configured to receive a differential signal at its input. Differential signaling may be selected to reduce the amount of noise and/or interference on the circuit as compared to single-ended signaling. In some embodiments, the input signals into amplifier 230 may be divided equally between main amplifier 232 and auxiliary amplifier 234 with an appropriate phase difference.

As an example, differential input signals 222 and 224 may be the input to main amplifier 232. The phase of input signal 222 ($P_{222}$) may be used to determine the phase of input signal 224 ($P_{224}$). In some embodiments, $P_{224}$ may be the complement of $P_{222}$, that is:

$$P_{224} = \overline{P_{222}}$$

In some embodiments, differential input signals 226 and 228 may be the input to auxiliary amplifier 234. The phase of input signal 226 ($P_{226}$) may be equal to $P_{222}$ shifted by one quarter wavelength, and the phase of input signal 228 ($P_{228}$) may be equal to $P_{224}$ shifted by one quarter wavelength. That is, the phase of the input signals to auxiliary amplifier 234 may be $\alpha(P_{222}, P_{224})$. Thus, $P_{228}$ may be the complement of $P_{226}$:

$$P_{228} = \overline{P_{226}}$$

In some embodiments, the differential outputs of main amplifier 232 may be input to transmission lines 236. The outputs of transmission lines 236 may be coupled to the differential outputs of auxiliary amplifier 234 to form amplified signals 240 which may be differential inputs to power combiner core 250. Transmission line 236 may be selected to transform the impedance of the signal output by main amplifier 232 so that it may be added constructively to the signal output by auxiliary amplifier 234 when both amplifiers are active. For example, transmission line 236 may be a quarter wavelength transmission line.

In some embodiments, auxiliary amplifier 234 may be coupled to tunable phase shifter 238. According to some embodiments, tunable phase shifter 238 may shift the phase of input signals 226 and 228. The output of tunable phase shifter 238 may be received by auxiliary amplifier 234. Adjusting the phase may control the amount of current flowing from amplifier 230 to power combiner core 250. Controlling the amount of current input into power combiner core 250 may allow the impedance of power combiner core 250 to be controlled. The following equations outline the relationship between the phase of the signal input to auxiliary amplifier 234 and the resulting impedance of power combiner core 250. In the equations, Z represents impedance, V represents voltage, I represents current, and $\Phi$ represents phase:

$$Z_{effective} = \frac{V}{I_1} \text{ or } \frac{|V|\angle\Phi_v}{|I_1|\angle\Phi_{I_1}}$$

$$= \left(1 + \frac{I_2}{I_1}\right) Z_0$$

$$= \left[1 + \frac{|I_2|}{|I_1|} \angle(\Phi_{I_2} - \Phi_{I_1})\right] Z_0$$

Thus, adjusting the phase of amplifiers 230 may allow for dynamic tuning of the power that is output from power combiner core 250.

Although FIG. 3 illustrates a particular embodiment that includes particular components that are each configured to provide certain functionality, alternative embodiments may include any appropriate combination of components with the described functionality divided between the components in any suitable manner.

Figure 4:
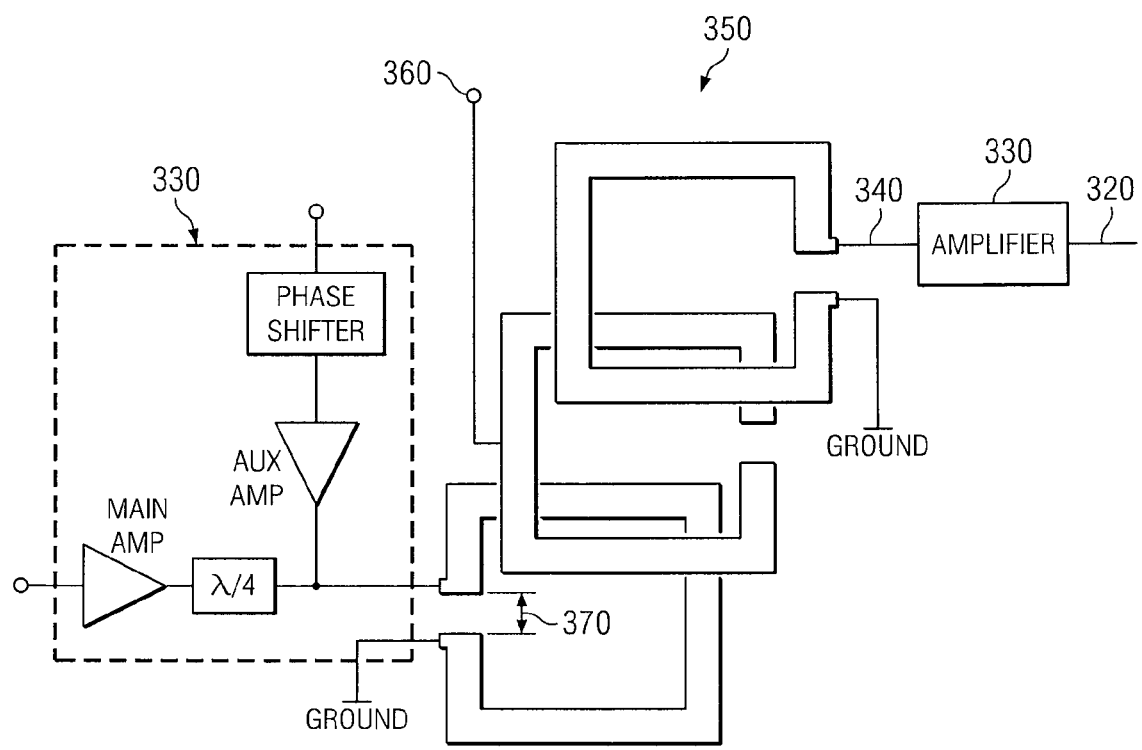
FIG. 4 illustrates an example of the power combiner core with a single-ended input.

FIG. 4 illustrates an example of a power combiner core 350, which may be like power combiner core 150, configured to receive a single-ended input. In some embodiments, a single input signal may be directed to amplifier 330. Amplifier 330 may generate a single output signal, amplified signal 340. Amplified signal 340 may be directed to power combiner core 350. In some embodiments, each layer of power combiner core 350 may be in the shape of a loop broken by break 370. An input layer may be connected to amplified signal 340 proximate to one side of break 370 and to ground proximate to the other side of break 370. In some embodiments, power combiner core 350 may combine amplified signals 340 to generate combined signal 360. According to some embodiments, single-ended signaling may be simpler and/or less expensive than differential signaling.

Although FIG. 4 illustrates a particular embodiment that includes particular components that are each configured to provide certain functionality, alternative embodiments may include any appropriate combination of components with the described functionality divided between the components in any suitable manner.

Figure 5:
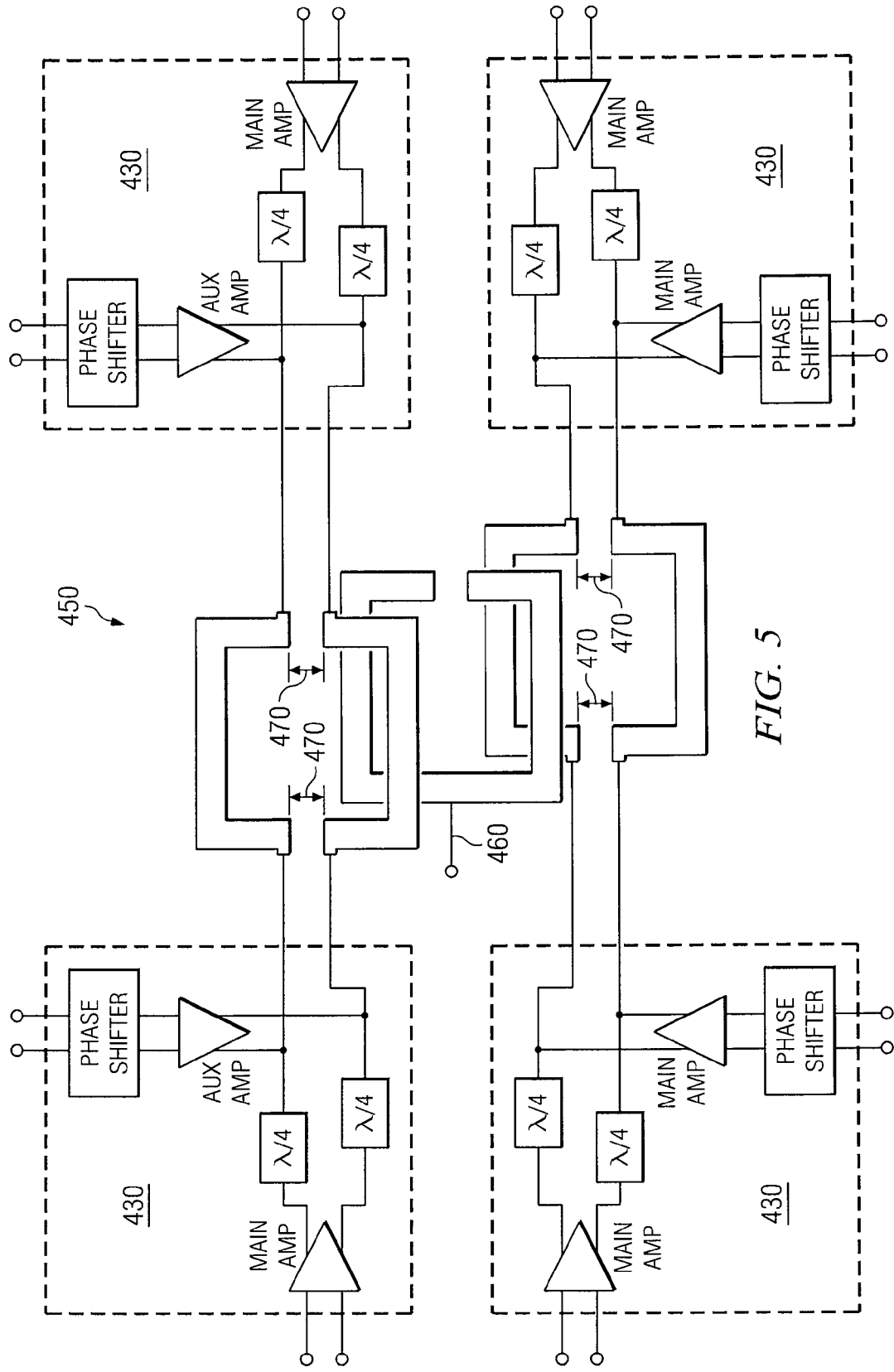
FIG. 5 illustrates an example of the power combiner core with multiple inputs.

The design of the power amplification system may be scalable. For example, FIG. 5 illustrates an example of a power combiner core 450, which may be like power combiner core 150, configured to accept inputs from additional amplifiers 430. Amplifiers 430 may be any suitable type of amplifier such as Doherty amplifiers connected in a differential signaling configuration. In some embodiments, the input layer(s) of power combiner core 450 may be in the shape of a broken loop comprising more than one break 470. An amplifier 430 may be connected proximate to each break 470 in the loop. The breaks 470 may be located at any suitable place on the loop. For example, a first break 470 may be located on one side of the loop, and a second break 470 may be located on the opposite side of the loop. As another example, a loop may comprise four breaks 470, with one break 470 located on each side of the loop. Power combiner core 450 may combine the signals of amplifiers 430 to generate combined signal 460.

Although FIG. 5 illustrates a particular embodiment that includes particular components that are each configured to provide certain functionality, alternative embodiments may include any appropriate combination of components with the described functionality divided between the components in any suitable manner.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed:

1. A system comprising:
    a power combiner configured to:
        receive at least two input signals; and
        combine the input signals to generate an output signal;
    the power combiner comprising a plurality of layers, the plurality of layers comprising:
        at least two input layers each configured to receive at least one input signal and an output layer configured to output the output signal, the output layer located between the input layers; and
        each layer of the plurality of layers comprising a slotted loop, wherein:
            the slotted loop of the input layers further comprises a break on one or more sides, the input layers configured to receive the input signals proximate to the break: and
            the slotted loop of the output layer further comprises a break on the side of the slotted loop opposite the side that outputs the output signal.

2. The system of claim 1, the input signals further comprising single-ended signals, the input layers configured to receive the input signals proximate to one side of the break.

3. The system of claim 1, the input signals further comprising differential signals, each differential signal comprising a first signal and a second signal, the input layers configured to receive the first signals proximate to one side of the break and the second signals proximate to the other side of the break.

4. The system of claim 1, further comprising at least one amplifier that provides one or more input signals to the power combiner.

5. The system of claim 4, wherein the amplifier comprises Doherty amplifiers.

6. The system of claim 4, further comprising at least one layer configured to receive the input signal from multiple amplifiers.

7. The system of claim 1, the plurality of layers coupled by stacking, the stacking configured to generate a capacitive power transfer.

8. The system of claim 1, the plurality of layers comprising a conductive material.

9. The system of claim 8, the conductive material selected from the group of conductive materials comprising copper, aluminum, silver, and/or gold.

10. The system of claim 1, the plurality of layers separated by an insulating material.

11. The system of claim 10, the insulating material selected from the group of insulating materials comprising silicon dioxide, silicon, gallium arsenide, and/or germanium.

12. A method comprising:
receiving at least two input signals at a power combiner; and
combining the input signals to generate an output signal;
the power combiner comprising a plurality of layers, the plurality of layers comprising:
at least two input layers each configured to receive at least one input signal and an output layer configured to output the output signal, the output layer located between the input layers; and
each layer of the plurality of layers comprising a slotted loop, wherein:
the slotted loop of the input layers further comprises a break on one or more sides, the input layers configured to receive the input signals proximate to the break; and
the slotted loop of the output layer further comprises a break on the side of the slotted loop opposite the side that outputs the output signal.

13. The method of claim 12, the input signals further comprising single-ended signals, the input layers configured to receive the input signals proximate to one side of the break.

14. The method of claim 12, the input signals further comprising differential signals, each differential signal comprising a first signal and a second signal, the input layers configured to receive the first signals proximate to one side of the break and the second signals proximate to the other side of the break.

15. The method of claim 12, further comprising at least one amplifier that provides one or more input signals to the power combiner.

16. The method of claim 15, wherein the amplifier comprises Doherty amplifiers.

17. The method of claim 15, further comprising at least one layer configured to receive the input signal from multiple amplifiers.

18. The method of claim 12, the plurality of layers coupled by stacking, the stacking configured to generate a capacitive power transfer.

19. The method of claim 12, the plurality of layers comprising a conductive material.

20. The method of claim 19, the conductive material selected from the group of conductive materials comprising copper, aluminum, silver, and/or gold.

21. The method of claim 12, the plurality of layers separated by an insulating material.

22. The method of claim 21, the insulating material selected from the group of insulating materials comprising silicon dioxide, silicon, gallium arsenide, and/or germanium.

* * * * *